United States Patent [19]
Johnson et al.

[11] Patent Number: 5,827,118
[45] Date of Patent: Oct. 27, 1998

[54] CLEAN STORAGE UNIT AIR FLOW SYSTEM

[75] Inventors: Roy P. Johnson, Yacolt; Donald L. Wilkinson, Camas, both of Wash.

[73] Assignee: Seh America, Inc., Vancouver, Wash.

[21] Appl. No.: 704,269

[22] Filed: Aug. 28, 1996

[51] Int. Cl.⁶ .................................................. F24F 3/16
[52] U.S. Cl. .......................... 454/187; 55/385.2; 55/467; 55/473
[58] Field of Search ............................ 454/57, 187, 228; 55/385.2, 467, 473

[56] References Cited

U.S. PATENT DOCUMENTS

| | | |
|---|---|---|
| 3,552,548 | 1/1971 | Wallestad et al. . |
| 4,506,595 | 3/1985 | Roberts et al. ......................... 454/187 |
| 4,676,884 | 6/1987 | Dimock et al. . |
| 5,390,785 | 2/1995 | Garric et al. . |
| 5,413,527 | 5/1995 | Dansui et al. ....................... 454/187 X |
| 5,514,196 | 5/1996 | Tanahashi et al. .................. 55/385.2 X |
| 5,525,106 | 6/1996 | Iizuka et al. ............................. 454/187 |
| 5,562,383 | 10/1996 | Iwai et al. ................................ 414/217 |

FOREIGN PATENT DOCUMENTS

| | | |
|---|---|---|
| 0290702 | 11/1991 | European Pat. Off. . |
| 53-120832 | 10/1978 | Japan ...................................... 454/187 |
| 63-247543 | 10/1988 | Japan ...................................... 454/187 |

OTHER PUBLICATIONS

Ossama A. Abdou et al., "Industrial Clean Rooms: Architectural Engineering Considerations" *Journal of Architectural Engineering*, pp. 37–52 (1995).

A. Das et al., "Laminar Flow and Clean Rooms" *Manuf. Chem. Aerosol News*, pp. 27–33 (1970).

C. Sooter et al., "Air Distribution in Clean Rooms" *Air Conditioning, Heating and Ventilation*, pp. 75–78 (May 1964).

S.A. Hoenig et al., "Improved Contamination Control in Semiconductor Manufacturing Facilities" *Solid State Technology*, pp. 119–123 (Mar. 1984).

R.I. Gross et al., "Laminar Flow Equipment: Performance and Testing Requirements" *Bull. Parenteral Drug Assoc.*, pp. 143–151 (May–Jun. 1976).

*Primary Examiner*—Harold Joyce
*Attorney, Agent, or Firm*—Bell Seltzer Intellectual Property Group of Alston & Bird LLP

[57] ABSTRACT

A storage system for storing clean room products includes an enclosed compartment located within or adjacent to a clean room. The compartment includes storage sheles and a horizontal air flow system that includes an air filter, an air exhaust, a blower, and a plenum.

15 Claims, 3 Drawing Sheets

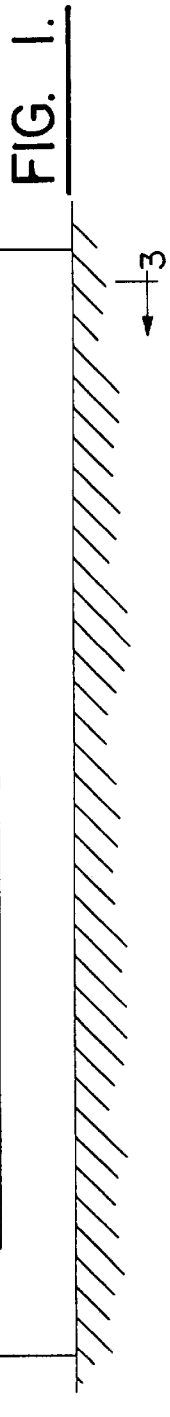

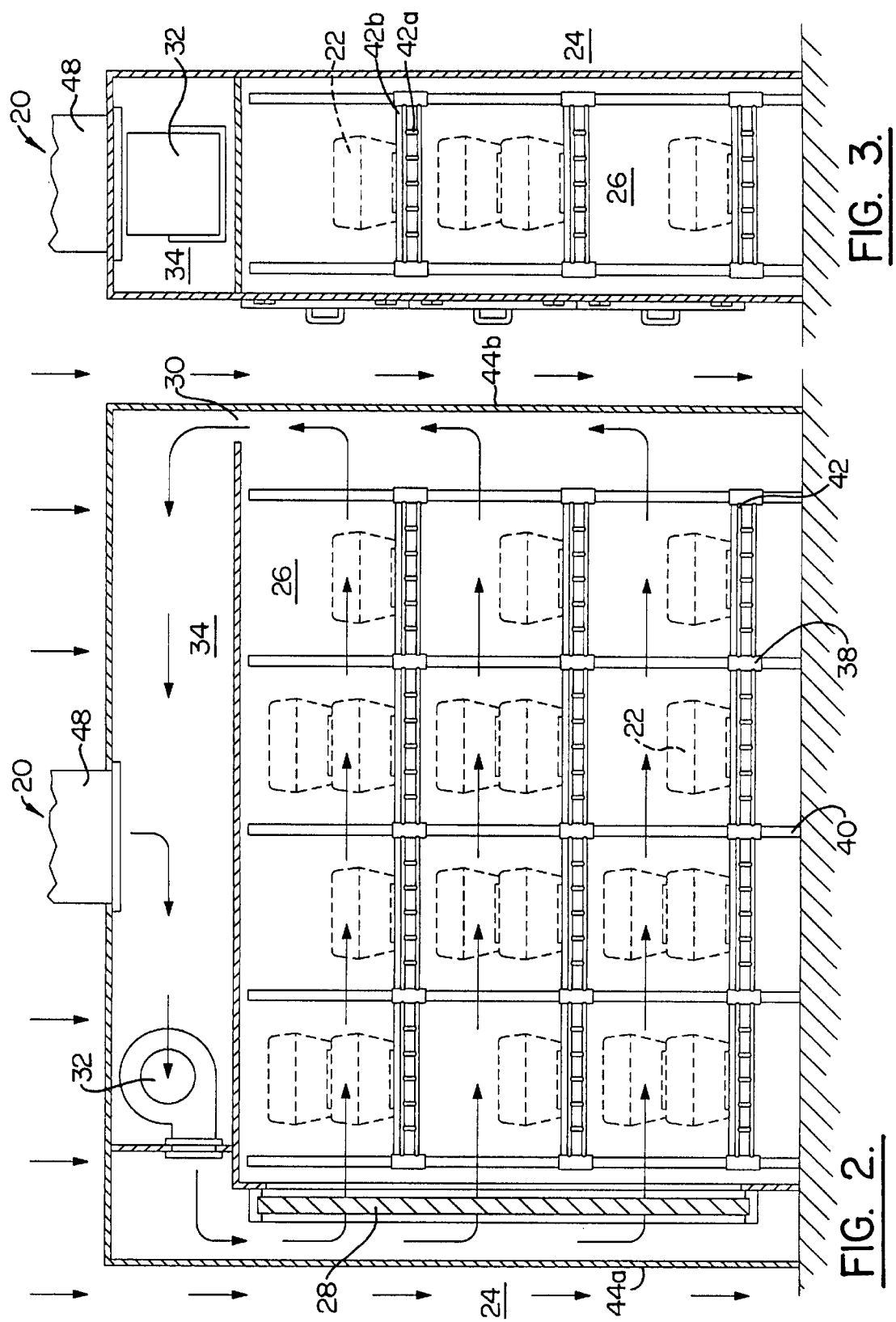

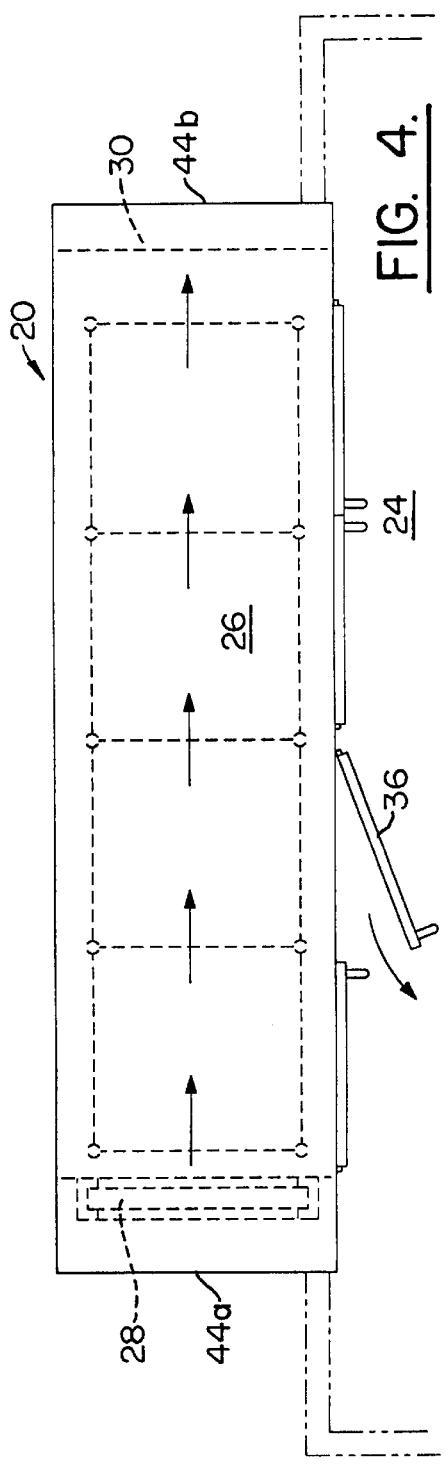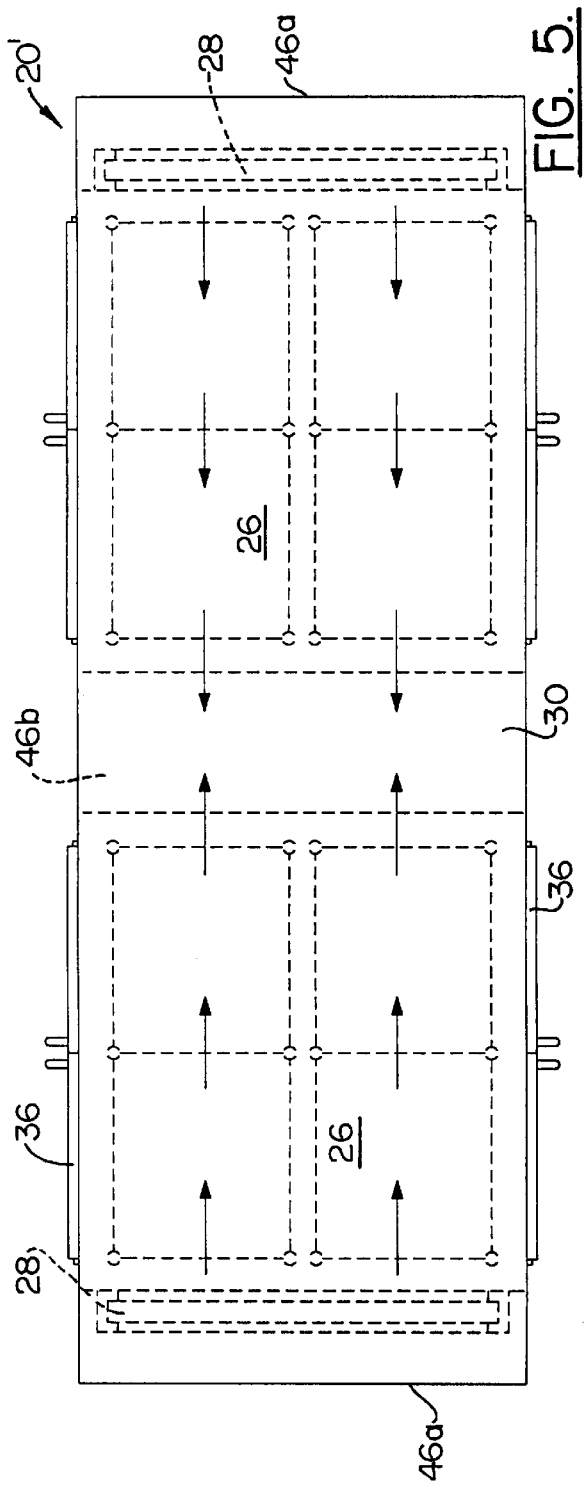

CLEAN STORAGE UNIT AIR FLOW SYSTEM

BACKGROUND OF THE INVENTION

The present invention relates to a system for clean storage units and particularly to a horizontal air flow system in isolated clean storage units, the horizontal flow system operating independently of the air flow in adjacent clean rooms.

A major factor in the consideration of clean room design is to keep airborne particles away from sensitive products such as semiconductor wafer surfaces. A primary source of contamination is the particles that settle on surfaces as the products are stored between processing steps. During any such storage period, particles inherently present in the environment tend to settle on any exposed surface.

To help prevent particles from settling on semiconductor wafer surfaces, the wafers are stored in boxes, which in turn are stored on shelving in the clean room. However, since such shelving is open to the environment, the surfaces of the boxes tend to become contaminated, even in a clean room. Further, placement or removal of boxes on the upper shelves tends to dislodge dust particles and then deposit them onto the shelves and boxes below. Also, particles that accumulate on the exterior of a box tend to transfer to the gloves of workers who handle the boxes, while particles on the gloves transfer to the surfaces of the boxes. Eventually, when the boxes are opened, the particles contaminate the interior of the box and ultimately the stored wafers.

To reduce contamination, typical clean rooms have specialized air flow systems. These systems generally introduce filtered air at one or more locations and exhaust the air at one or more locations. Air that is introduced is filtered by such systems as an "ultra low penetration air" (ULPA) filter system. ULPA filters such as those produced by General Precision Inc. of Valencia, Calif., can filter particles down to 0.12 $\mu$m at 99.999% efficency.

Many clean room designs incorporate vertical (ceiling to floor) laminar air flows with a positive air pressure between the ceiling and the floor. Particles generated between the ceiling and the floor, or particles not captured by the air filters, tend to follow the downward flow of air. However, many particles within such laminar flow environments nevertheless settle on work surfaces, equipment, or products. Other clean room designs incorporate horizontal flows which flush particles in a horizontal direction. Horizontal flows, however, tend to pass contamination from one side of the room to another.

What is needed, then, is a system to store contamination-sensitive products that reduces the possibility of contamination.

SUMMARY OF THE INVENTION

A storage system for storing clean room products according to the present invention includes an enclosed compartment located within or adjacent to a clean room. The compartment includes a horizontal air flow system that includes a first air filter at at least one end of the compartment, an air exhaust horizontally spaced from the first air filter, a blower or fan for forcing air through the first air filter to the air exhaust, and a plenum for returning air from the air exhaust to the blower. A shelving system is also included within said compartment for storing the products.

In one embodiment the first air filter is located at one end of the compartment and the exhaust is located at the opposite end. In an alternate embodiment, first air filters are located on opposite ends of the compartment and the exhaust is centrally located.

To replace air that has been blocked or has escaped from the compartment, air may be added to the system. Added air is filtered first through a second air filter and then through the first air filter before it enters the main body of the compartment.

Some of the advantages of the present system are a cleaner environment by several orders of magnitude, a minimzation of shelf-to-shelf contamination, and a continuous washing of storage boxes by clean ULPA-filtered air.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a front view of a clean storage unit of the present invention.

FIG. 2 is a front sectional view of the clean storage unit with air flow indicated by arrows.

FIG. 3 is a cross sectional view of the clean storage unit taken along lines 3—3 of FIG. 1.

FIG. 4 is a plan view of the clean storage unit adjacent a clean storage room.

FIG. 5 is a plan view of an alternate embodiment of the clean storage unit.

DETAILED DESCRIPTION OF PREFERRED EMBODIMENTS

FIGS. 1–5 show a storage system 20 for storing clean room products 22 (shown in phantom) such as wafers, cassettes, other contamination-sensitive products, and boxes for storing such products. The storage system 20 may include a clean room 24 and an enclosed compartment 26 located within or adjacent to the clean room 24. The compartment 26 includes a horizontal air flow system (air flow is shown by directional arrows) that includes a first air filter 28 such as an ULPA filter at at least one end of the compartment 26, an air exhaust 30 horizontally spaced from the first air filter 28, a blower or fan 32 for forcing air through the first air filter 28 to the air exhaust 30, and a plenum 34 for returning air from the air exhaust 30 to the blower 32.

As shown in FIG. 1, the compartment 26 is accessible through a plurality of small glass panel doors 36 which are typically 2'×2' in dimension. This small size minimizes disturbance to the air flow when the doors 36 are opened. The doors 36 are constructed from clean room-acceptable material such as glass and/or stainless steel. Depending on the use of the storage system 20, doors 36 may be located on the front of the compartment 26 as shown in FIG. 4. Alternatively, as shown in FIG. 5, the doors 36 may be located on both the front and back of the compartment 26. This is particularly advantageous when the compartment 26 is wide, is free standing, or is located between two clean rooms 24.

Products 22 are stored within the compartment 26 on a shelving system 38 shown in FIGS. 2 and 3. The shelving system 38 is preferably highly polished stainless steel shelving having vertical supports 40 and horizontal shelves 42 such as the clean room shelving made by Farwest of Portland, Oreg. One important feature of the shelving is that it has a solid surface. Accordingly, one embodiment includes shelves 42 that include a metal grill 42a that supports a plastic or glass surface sheet 42b. The solid surface provides two features. First, the solid shelving 42 helps eliminate migration of particles to products 22 stored on lower shelves. Second, the solid shelving 42 helps to direct air flow horizontally.

Another embodiment of the storage system 20, depicted in FIGS. 2 and 4, includes a horizontal air flow system in which air flows horizontally for the approximate length of the compartment 26 from a filter end 44a of the compartment 26 to an exhaust end 44b. In this embodiment, air is filtered by a first air filter 28 at the filter end 44a and flows horizontally over the shelving system 38. The air then flows upwardly through the air exhaust 30 at the exhaust end 44b. The air exhaust 30 is preferably a gap or space extending the width of the compartment 26 and is located between the main body of the compartment 26 and the lower surface of the plenum 34 at the exhaust end 44b. The air then flows through the plenum 34 into the blower 32, which forces the air back through the first air filter 28.

An alternate embodiment of the storage system 20', depicted in FIG. 5, includes a horizontal air flow system in which air flows horizontally from opposite filter ends 46a at opposite ends of the compartment 26 to a central exhaust 46b (shown in phantom). In this embodiment, air is filtered by first air filters 28 (shown in phantom) at the filter ends 46a and flows horizontally over the shelving system 38. The air then flows upwardly through the centrally located air exhaust 46b. The air exhaust 30 in this embodiment may be a gap between the main body of the compartment 26 and the lower surface of the plenum 34, or it may be a walled duct with multiple vents or openings leading thereto. The air would then flow through the plenum 34, into the blowers 32 (not shown) at opposite filter ends 46a, and back through the first air filters 28.

Air velocity in the system 20 is preferably kept low (approximately 40 feet per minute) because 70%–80% of the flow is blocked by stored product 22. Accordingly, additional air, or make-up air is must be introduced to the system 20. This make-up air is supplied through at least one ceiling mounted second air filter 48 such as an ULPA filter unit. As shown in FIGS. 2 and 3, the second air filter 48 is preferably mounted on the upper surface of the plenum 34 between the exhaust 30 and the blower 32. Air that is introduced through the second air filter 48 flows through the blower 32 and then through the first air filter 28 so that it is double-filtered before it enters the main body of the compartment 26.

One feature of the storage system 20 is that it comprises an environment that is isolated from the rest of the clean room 24. Accordingly, the horizontal air flow within the compartment 26 is independent from the air flow of the clean room 24 which may have horizontal or vertical air flow. Also, the compartment 26 preferably has a higher air pressure than does the clean room 24. This is extremely important because, as shown in FIG. 4, the air within the compartment 26 will flow into the clean room 24 when the door 36 is opened. Since air is flowing out of the compartment 26, the relatively dirty air of the clean room 24 cannot enter the compartment 26.

The storage system 20 may also include an ionization or static system (not shown) mounted just downstream of the first air filter 28 that helps to further minimize particle adherence on the boxes. Generally the charge-emitting element of the ionization system is an elongated strip that is mounted vertically. The ionization or static system may be an electrostatic discharge unit such as those made by Static Control Services of Denver, Colo.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A storage system for storing clean room articles, said system comprising:
   (a) an enclosed storage compartment having a plurality of doors, wherein said storage compartment opens into a clean room upon opening any one of said doors;
   (b) a shelving system within said compartment, said shelving system directly accessible through any one of said plurality of doors; and
   (c) a horizontal air flow system within said compartment comprising:
      (1) first air-filtering means at at least one end of said compartment;
      (2) air exhaust means horizontally spaced from said filter means;
      (3) blower means for forcing air through said first air-filtering means to said air exhaust means; and
      (4) a plenum for returning air from said air exhaust means to said blower means.

2. The storage system of claim 1 wherein said first air-filtering means is on one end of said compartment and said air exhaust means is on an opposite end of said compartment.

3. The storage system of claim 1 wherein said air exhaust means is centrally located within said compartment and said first air-filtering means is on both opposite ends of said compartment.

4. The storage system of claim 1 wherein said first air-filtering means is an ultra low penetration air filter system.

5. The storage system of claim 1 further comprising a second air-filtering means above said plenum and before said first air-filtering means, said second air-filtering means filtering air added to said storage system.

6. The storage system of claim 5 wherein said second air-filtering means is an ultra low penetration air filter system.

7. The storage system of claim 1 wherein said shelving system includes solid shelves.

8. The storage system of claim 1 wherein said shelving system includes solid plastic covering steel grid horizontal shelves.

9. The storage system of claim 1 wherein said plurality of doors comprise a plurality of glass panel doors.

10. The storage system of claim 1 wherein said plurality of doors comprise a plurality of front glass panel doors and a plurality of back glass panel doors.

11. A storage system for storing clean room articles, said system comprising in combination:
   (a) a clean room;
   (b) an enclosed storage compartment having a plurality of doors, said storage compartment accessible from said clean room via any one of said doors, said compartment having horizontally spaced first and second sides;
   (c) first air-filtering means at said first side;
   (d) air exhaust means at said second side;
   (e) horizontal flow means for forcing air through said first air-filtering means to said air exhaust means; and (f) a shelving system within said compartment, said shelving system being directly accessible from said clean room through any one of said plurality of doors.

12. The storage system of claim 11 further comprising a second air-filtering means for filtering air added to said storage system.

13. The storage system of claim 11, said compartment having horizontally spaced third and fourth sides perpendicular to said first and second sides, at least one of said plurality of doors being on said third side and at least one of said plurality of doors being on said fourth side, said shelving system being directly accessible through said at least one door on said third side and through said at least one door on said fourth side.

14. The storage system of claim 11 wherein air flows vertically from ceiling to floor within said clean room.

15. A storage system for storing clean room articles, said system comprising:

(a) an enclosed storage compartment having a plurality of doors;

(b) a shelving system having at least one shelf, said shelving system within said compartment directly accessible through any one of said doors, wherein at least one door is associated with each shelf;

(c) at least one storage box, said storage box insertable through any one of said doors and suitable for storing on said at least one shelf of said shelving system; and (d) a horizontal air flow system within said compartment comprising:
  (1) first air-filtering means at at least one end of said compartment;
  (2) air exhaust means horizontally spaced from said filter means;
  (3) blower means for forcing air through said first air-filtering means to said air exhaust means; and
  (4) a plenum for returning air from said air exhaust means to said blower means.

* * * * *